(12) United States Patent
Lin et al.

(10) Patent No.: US 9,859,440 B2
(45) Date of Patent: Jan. 2, 2018

(54) THIN FILM TRANSISTOR AND METHOD OF MANUFACTURING SAME

(71) Applicant: HON HAI PRECISION INDUSTRY CO., LTD., New Taipei (TW)

(72) Inventors: Hsin-Hua Lin, New Taipei (TW); Yi-Chun Kao, New Taipei (TW); Chih-Lung Lee, New Taipei (TW); Po-Li Shih, New Taipei (TW); Kuo-Lung Fang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/832,797

(22) Filed: Aug. 21, 2015

(65) Prior Publication Data

US 2016/0163864 A1 Jun. 9, 2016

(30) Foreign Application Priority Data

Dec. 3, 2014 (TW) .............................. 103141866 A (51) Int. Cl.
*H01L 21/441* (2006.01)
*H01L 21/027* (2006.01)
(Continued)

(52) U.S. Cl.
CPC ...... *H01L 29/7869* (2013.01); *H01L 21/0274* (2013.01); *H01L 21/32139* (2013.01);
(Continued)

(58) Field of Classification Search
CPC ... H01L 29/7869; H01L 29/45; H01L 29/518; H01L 29/4908; H01L 29/66969; H01L 21/02554; H01L 21/0274; H01L 21/441; H01L 21/02565; H01L 21/47573; H01L 21/47635; H01L 21/027; H01L 21/31144; H01L 21/32139; H01L 27/127; H01L 27/3262; H01L 27/32; H01L 27/3276; H01L 29/41733; H01L 33/44; H01L 33/52; H01L 28/60; H01L 51/0023; H01L 51/5234; H01L 51/5237; H01L 51/5253; H01L 29/786–29/78696;
(Continued)

(56) References Cited

U.S. PATENT DOCUMENTS

2006/0043377 A1    3/2006   Hoffman et al.
2008/0014686 A1*   1/2008   Wang .................... H01L 51/057
                                                                   438/156

(Continued)

FOREIGN PATENT DOCUMENTS

TW    201218383 A    5/2012
TW    201437729 A   10/2014

*Primary Examiner* — Natalia Gondarenko
(74) *Attorney, Agent, or Firm* — ScienBiziP, P.C.

(57) ABSTRACT

A thin film transistor can include a substrate, a gate electrode on the substrate, a first electrode located on the substrate and surrounded by the gate electrode, a second electrode located on the first electrode and surrounded by the gate electrode, and a channel layer located between the first electrode and the second electrode. The gate electrode can include a first margin metal layer on the substrate and a second metal layer located on the first margin metal layer. A method for manufacturing the thin film transistor is also provided.

13 Claims, 13 Drawing Sheets

(51) Int. Cl.
*H01L 29/786* (2006.01)
*H01L 29/45* (2006.01)
*H01L 21/4763* (2006.01)
*H01L 29/49* (2006.01)
*H01L 29/423* (2006.01)
*H01L 21/3213* (2006.01)
*H01L 29/66* (2006.01)

(52) U.S. Cl.
CPC .... *H01L 29/42384* (2013.01); *H01L 29/4908* (2013.01); *H01L 29/78642* (2013.01)

(58) Field of Classification Search
CPC ............ H01L 29/66742–29/6678; H01L 29/42384–29/42392; H01L 29/458; H01L 2924/1307; H01L 2924/13069; H01L 2029/42388; H01L 51/0508–51/057; H01L 27/12–27/1255; H01L 27/1259–27/1296; H01L 27/3248; H01L 27/3274
USPC ............ 257/43, E29.068, E21.616; 438/151
See application file for complete search history.

(56) References Cited

U.S. PATENT DOCUMENTS

| | | | |
|---|---|---|---|
| 2008/0197354 A1* | 8/2008 | Cho | H01L 27/1214 257/59 |
| 2009/0111198 A1* | 4/2009 | Fujikawa | H01L 27/1288 438/22 |
| 2011/0101337 A1* | 5/2011 | Yamazaki | H01L 27/1225 257/43 |
| 2011/0121288 A1* | 5/2011 | Yamazaki | H01L 27/1225 257/43 |
| 2013/0045602 A1* | 2/2013 | Lu | H01L 21/31144 438/700 |
| 2013/0162925 A1* | 6/2013 | Wang | H01L 27/1288 349/43 |
| 2013/0210201 A1* | 8/2013 | Tang | H01L 27/1288 438/151 |
| 2015/0162563 A1* | 6/2015 | Ide | H01L 51/5253 257/40 |

* cited by examiner

THIN FILM TRANSISTOR AND METHOD OF MANUFACTURING SAME

FIELD

The subject matter herein generally relates to thin film transistors, and particularly to a vertical type thin film transistor. The present disclosure is also related to a method for manufacturing such vertical type thin film transistor.

BACKGROUND

Thin film transistors generally include planar type thin film transistors and vertical type thin film transistors. The planar type thin film transistors are easy to be integrated into circuits, so the planar type thin film transistors are widely used in the circuits.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure presents a method for manufacturing a thin film transistor. The method can include: providing a substrate and successively forming a first metal layer, a second metal layer and a first photoresist layer on the substrate; patterning the first photoresist layer to form a first photoresist pattern including a first margin photoresist pattern and first middle photoresist pattern spaced apart from the first margin photoresist pattern; etching the first metal layer and the second metal layer to form a first margin metal layer corresponding to the first margin photoresist pattern, a second margin metal layer corresponding to the first margin photoresist pattern, a first middle metal layer corresponding to the first middle photoresist pattern, and a second middle metal layer corresponding to the first middle photoresist pattern; removing the first middle photoresist pattern; removing the second middle metal layer; removing the first margin photoresist pattern; forming a semiconductor layer covering the substrate, the second margin metal layer, and the first middle metal layer, removing a part of the semiconductor layer which covers the substrate to form a margin semiconductor layer on the second margin metal layer and a middle semiconductor layer on the first middle metal layer; forming a third metal layer covering the substrate, the margin semiconductor layer and the middle semiconductor layer, forming a second photoresist pattern on the third metal layer and corresponding to the middle semiconductor layer; removing the margin semiconductor layer and a part of the third metal layer which are not covered by the second photoresist pattern to form a third middle metal layer; and removing the second photoresist pattern.

The present disclosure further presents a thin film transistor. The thin film transistor can include a substrate, a gate electrode on the substrate, a first electrode located on the substrate and surrounded by the gate electrode, a second electrode located on the first electrode and surrounded by the gate electrode, and a channel layer located between the first electrode and the second electrode. The gate electrode can include a first margin metal layer on the substrate and a second metal layer located on the first margin metal layer.

Figure 1:
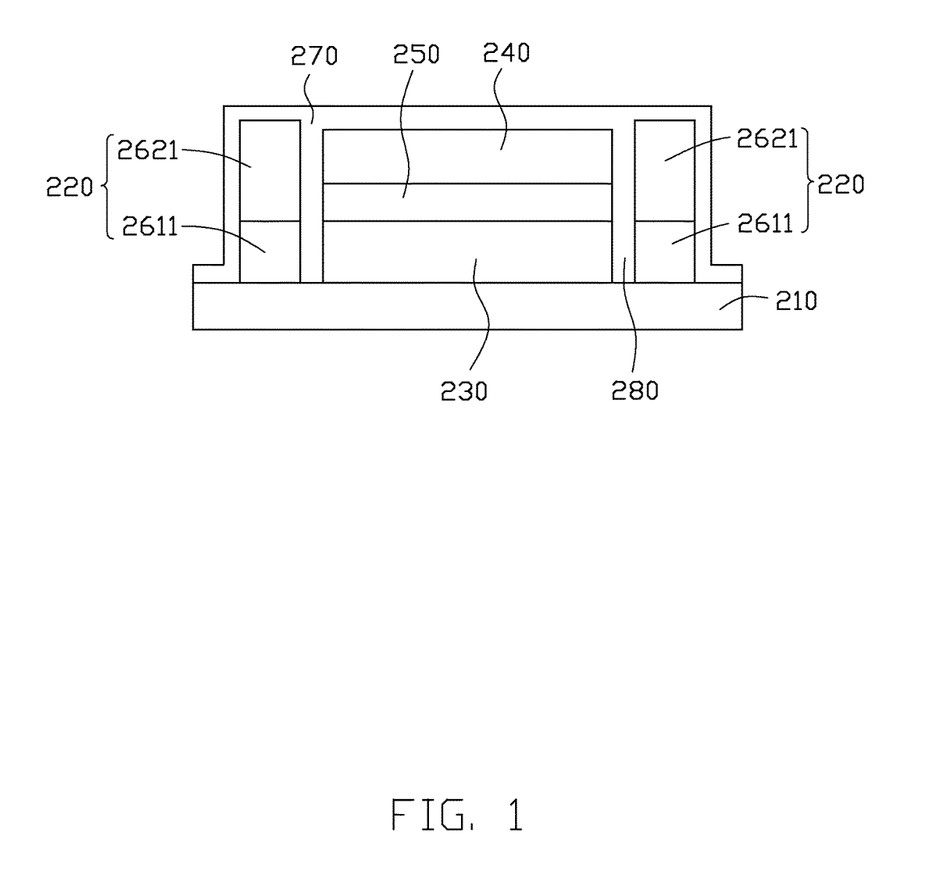
FIG. 1 is a diagrammatical view of a vertical thin film transistor in accordance with an embodiment of the present disclosure.

FIG. 1 illustrates a vertical type thin film transistor 200. The thin film transistor 200 can include a substrate 210, a gate electrode 220 on the substrate 210, a first electrode 230 on the substrate 210 and surrounded by the gate electrode 220, a second electrode 240 on the first electrode 230 and surrounded by the gate electrode 220, a channel layer 250 located between the first electrode 230 and the second electrode 240 and surrounded by the gate electrode 220, and an electrically insulating layer 270 covering the gate electrode 220. The first electrode 230 can be one of a source electrode and a drain electrode. The second electrode 240 can be the other of the source electrode and the drain electrode. In at least one embodiment, the first electrode 230 is the source electrode of the thin film transistor 200, the second electrode 240 is the drain electrode of the thin film transistor 200. The first electrode 230 and the second electrode 240 are coupled to the channel layer 250 in electrical conduction.

In this embodiment, the substrate 210 is transparent. The substrate 210 can be a transparent glass board. The substrate 210 includes a first face facing the gate electrode 230 and the first electrode 230, and a second face opposite to the first face.

The gate electrode 220 is located on a periphery portion of the first face of the substrate 210. The gage electrode 220 can include a first margin metal layer 2611 on the periphery portion of the first face of the substrate 210 and a second margin metal layer 2621 located on the first margin metal layer 2611. In at least one embodiment, the first margin metal layer 2611 is in direct physical contact with the first face of the substrate 210.

The first electrode 230 is located on a middle portion of the first face of the substrate 210. In at least one embodiment, the first electrode 230 is in direct physical contact with the first face of the substrate 210.

The channel layer 250 is located on the first electrode 230 and over the middle portion of the first face of the substrate 210.

The second electrode 240 is located on the channel layer 250 and over the middle portion of the first face of the substrate 210.

The thin film transistor 200 defines a passage 280 between the gate electrode 220 and the first electrode 230, the channel layer 250 and the second electrode 240. The first face of the substrate 210 is not covered by the gate electrode 220 and the first electrode 230 in the passage 280. The periphery portion of the first face of the substrate 210 extends outwards at least partially beyond the gate electrode 220.

The electrically insulating layer 270 covers the gate electrode 220, the second electrode 240, and the periphery portion of the first face of the substrate 210 which extends beyond the gate electrode 220. The electrically insulating layer 270 can fill in the passage 280 and covers the first face of the substrate 210 exposed to the passage 280. The electrically insulating layer 270 in the passage 280 is located between the gate electrode 220 and the first electrode 230 to make the gate electrode 220 electrically insulated from the first electrode 230. The electrically insulating layer 270 in the passage 280 is located between the gate electrode 220 and the channel layer 250 to make the gate electrode 220 electrically insulated from the channel layer 250. The electrically insulating layer 270 in the passage 280 is located between the gate electrode 220 and the second electrode 240 to make the gate electrode 220 electrically insulated from the second electrode 240.

The first margin metal layer 2611 has a material same as that of the first electrode 230. The first margin metal layer 2611, the second margin metal layer 2621 and the second electrode 240 have materials different from each other. In at least one embodiment, the material of the first margin metal layer 2611 and the first electrode 230 can be titanium. The material of the second margin metal layer 2621 can be aluminum. The material of the second electrode 240 can be copper.

Figure 2:
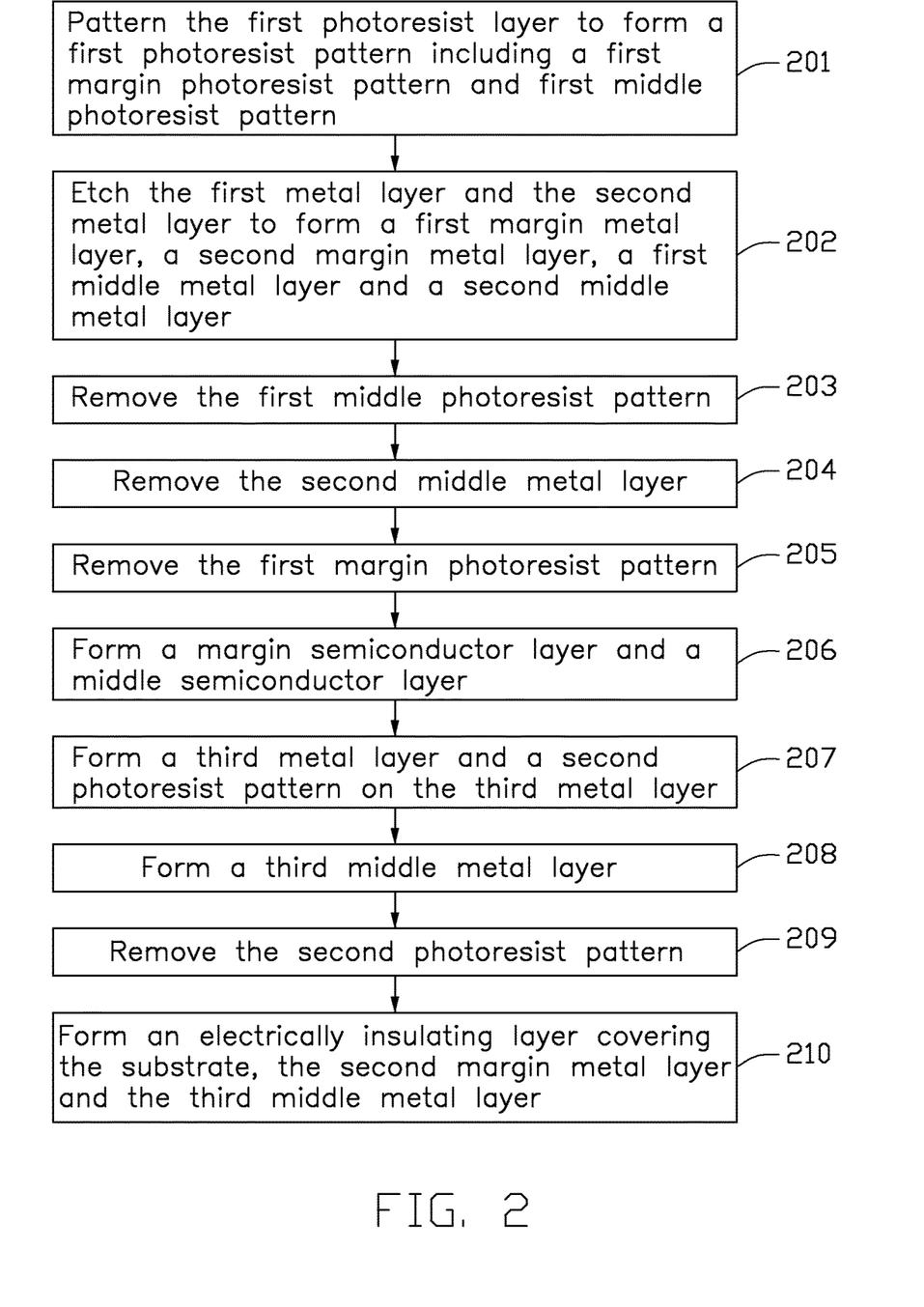
FIG. 2 is a flowchart showing a method for forming the vertical thin film transistor of FIG. 1 in accordance with an embodiment of the present disclosure.

FIG. 2 illustrates a flowchart of an example method for manufacturing the thin film transistor 200. The example method is provided by way of example, as there are a variety of ways to carry out the method. The example method described below can be carried out using the configurations illustrated in FIGS. 1 and 3-13, for example, and various elements of these figures are referenced in explaining the example method. Each block shown in FIG. 2 represents one or more processes, methods or subroutines, carried out in the example method. Furthermore, the illustrated order of blocks is illustrative only and the order of the blocks can change according to the present disclosure. Additional blocks can be added or fewer blocks may be utilized, without departing from this disclosure. The example method can begin at block 201.

Figure 3:
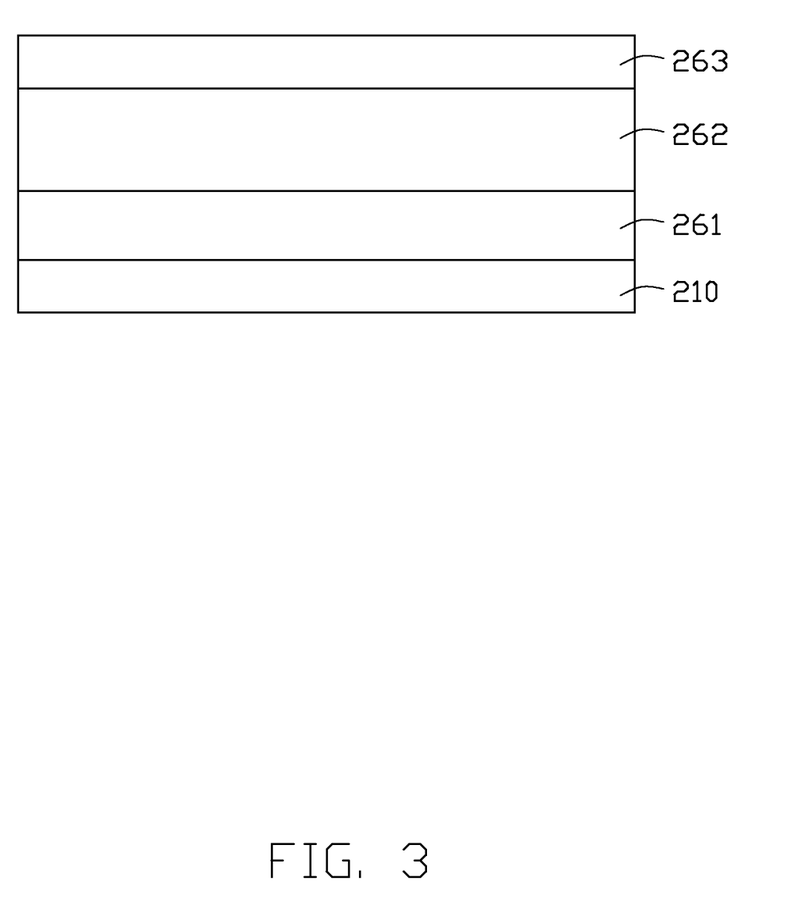
FIG. 3 is a diagrammatical view showing a structure of a substrate, a first metal layer, a second metal layer and a first photoresist layer.

At block 201, also referring to FIG. 3, in which the substrate 210 is provided, a first metal layer 261, a second metal layer 262 and a first photoresist layer 263 are successively formed on the substrate 210. The substrate 210 includes a first face and a second face opposite to the first face. The first metal layer 261 is formed on the first face of the substrate 210. The second metal layer 262 is successively formed on the first metal layer 261. Then, the first photoresist layer 263 is formed on the second metal layer 262. The first metal layer 261 is different from the second metal layer 263 in material. In at least one embodiment, the material of the first metal layer 261 is titanium. The material of the second metal layer 262 is aluminum.

Figure 4:
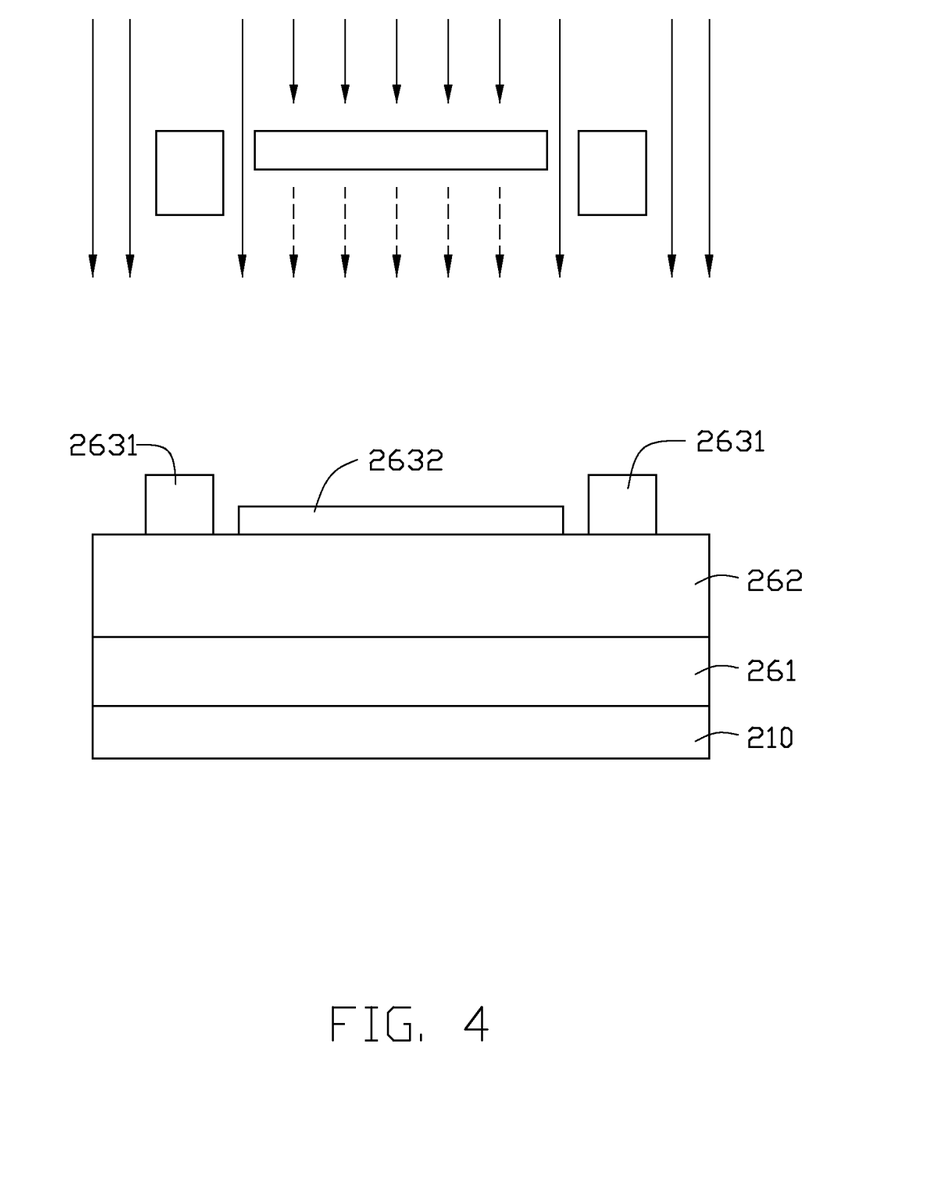
FIG. 4 shows a structure of FIG. 3 after the first photoresist layer is patterned.

At block 202, also referring to FIG. 4, the first photoresist layer 263 is patterned to form a first photoresist pattern by a way of Gray-scale mask pattern. The first photoresist pattern includes a first margin photoresist pattern 2631 and first middle photoresist pattern 2632. The first margin photoresist pattern 2631 is located on a periphery portion of the second metal layer 262. The first middle photoresist pattern 2632 is located on a middle portion of the second metal layer 262. The first margin photoresist pattern 2631 surrounds and is spaced apart from the first middle photoresist pattern 2632. The first margin photoresist pattern 2631 has thickness larger than that of the first middle photoresist pattern 2632.

Figure 5:
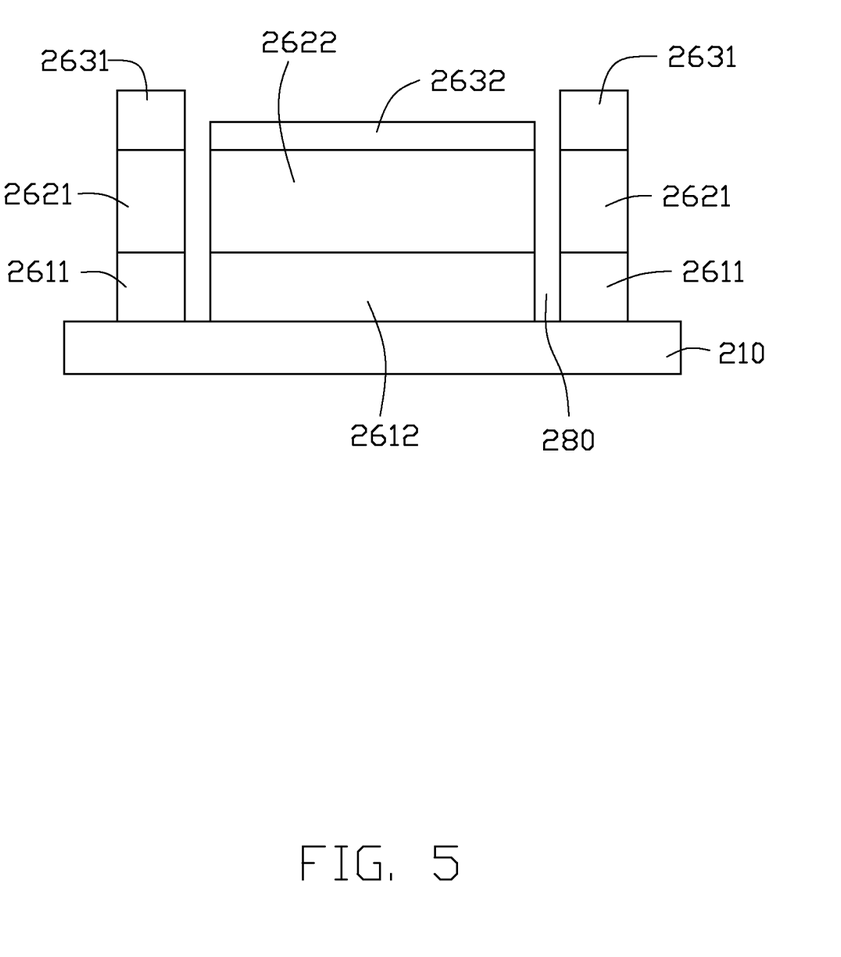
FIG. 5 shows a structure of FIG. 4 after the first metal layer and the second metal layer are etched.

At block 203, also referring to FIG. 5, the first metal layer 261 and the second metal layer 262 are etched. After etching, the first metal layer 261 includes the first margin metal layer 2611 corresponding to the first margin photoresist pattern 2631 and a first middle metal layer 2612 corresponding to the first middle photoresist pattern 2632. The second metal layer 262 include the second margin metal layer 2621 covered by the first margin photoresist pattern 2631 and a second middle metal layer 2622 covered by the first middle photoresist pattern 2632. The first margin metal layer 2611 and the second margin metal layer 2621 cooperatively form the gate electrode 220 of the thin film transistor 200. The first middle metal layer 2612 forms the source electrode or the drain electrode of the thin film transistor 200. The passage 280 is defined between the gate electrode 220 and the first middle metal layer 2612 and the second middle metal layer 2622.

Figure 6:
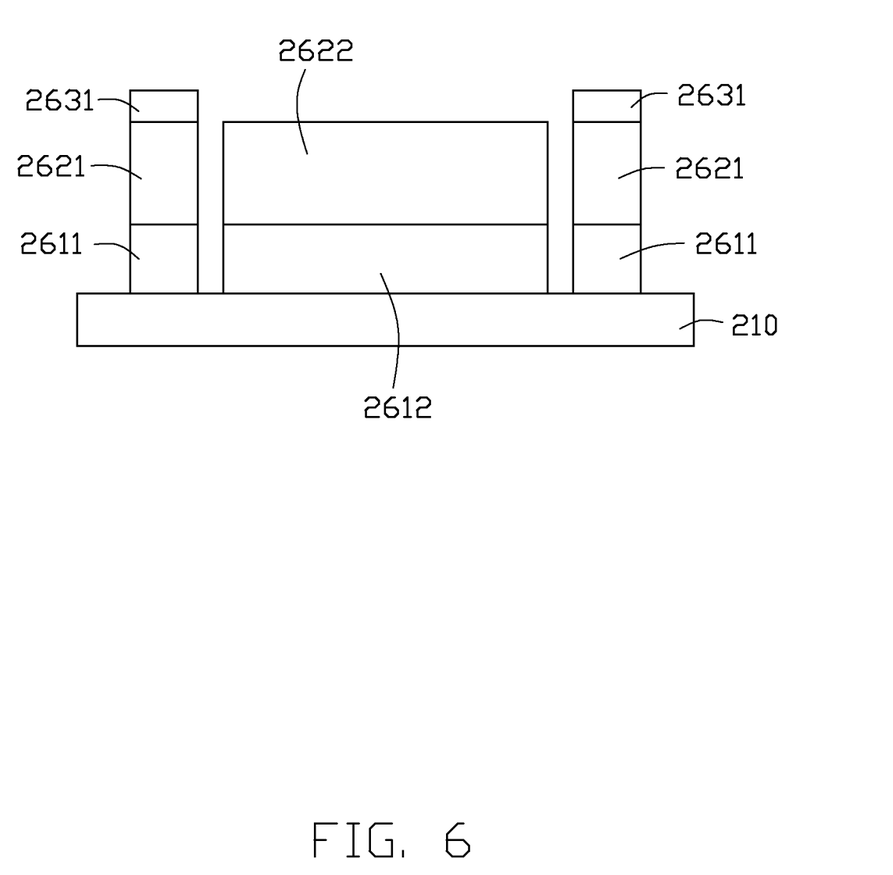
FIG. 6 shows a structure of FIG. 5 after a first middle photoresist pattern is removed.

At block 204, also referring to FIG. 6, the first middle photoresist pattern 2632 is removed. In at least one embodiment, an entire thickness of the first photoresist pattern is reduced by an oxygen ions ashing process until the first middle photoresist pattern 2632 is removed. Because the first margin photoresist pattern 2631 has the thickness larger than the first middle photoresist pattern 2632, after the first middle photoresist pattern 2632 is removed, part of the first margin photoresist pattern 2631 is still reserved.

Figure 7:
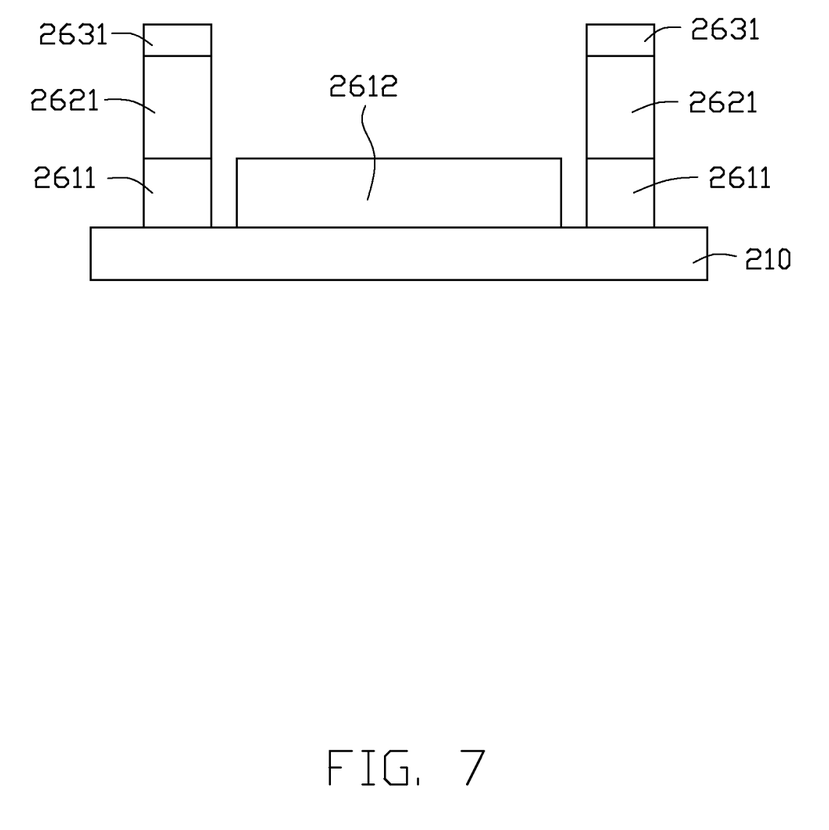
FIG. 7 shows a structure of FIG. 6 after a second middle metal layer is removed.

At block 205, also referring to FIG. 7, the second middle metal layer 2622 is removed by etching. Because the first metal layer 261 has an etching rate different from that of the second metal layer 262, the first middle metal layer 2612 cannot be destroyed when the second middle metal layer 2622 is removed by etching.

Figure 8:
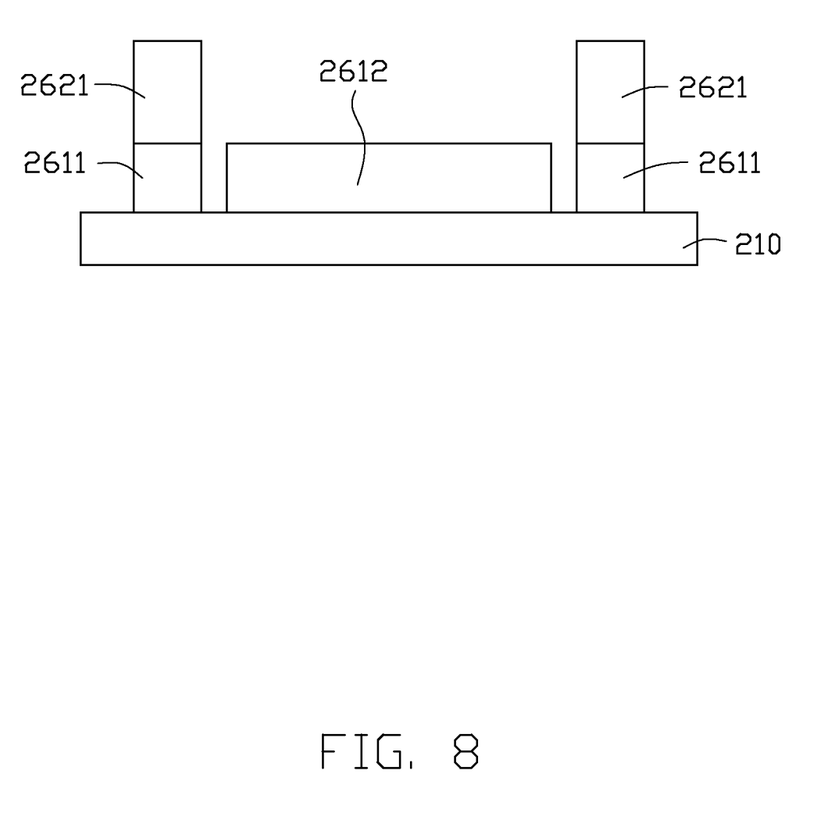
FIG. 8 shows a structure of FIG. 7 after a first margin photoresist pattern is removed.

At block 206, also referring to FIG. 8, the first margin photoresist pattern 2631 is removed.

Figure 9:
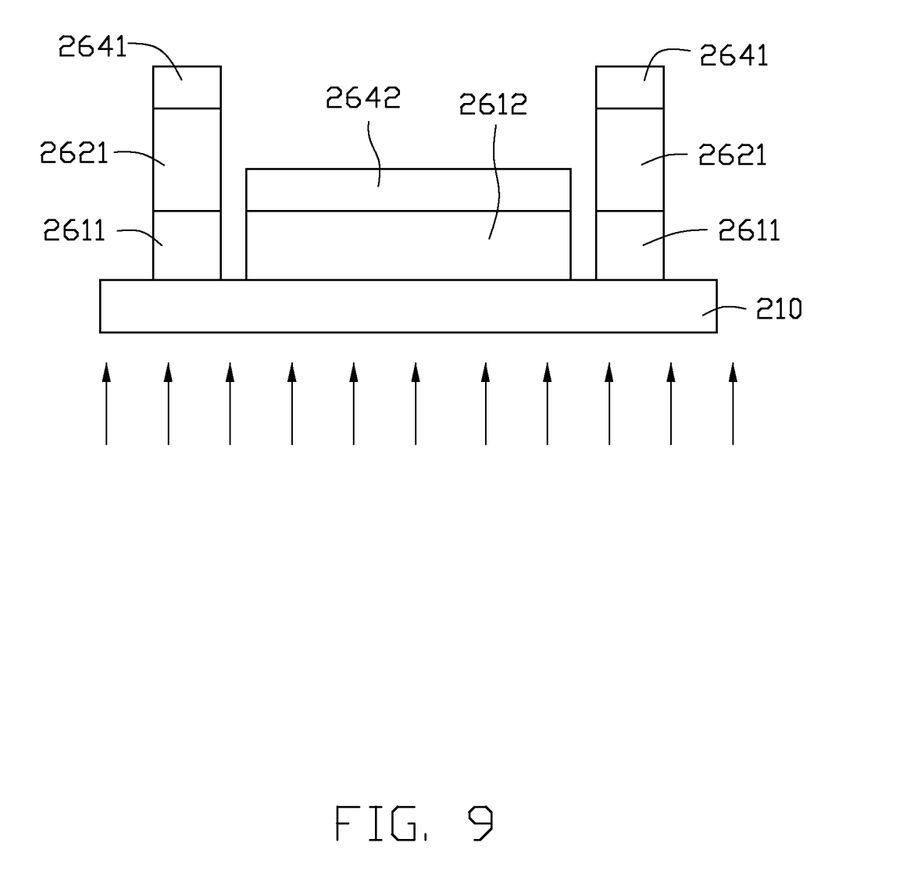
FIG. 9 shows a structure of FIG. 8 after a margin semiconductor layer and a middle semiconductor layer are formed.

At block 207, also referring to FIG. 9, a semiconductor layer is formed on and covers the substrate 210, the second margin metal layer 2621, and the first middle metal layer 2612, a part of the semiconductor layer which covers the substrate 210 is removed to form a margin semiconductor layer 2641 on the second margin metal layer 2621 and a middle semiconductor layer 2642 on the first middle metal layer 2612. In at least one embodiment, after the semiconductor layer is formed, the substrate 210 with the semiconductor layer is photo-etched from the second face remote from the second margin metal layer 2621 and the first middle metal layer 2612, to remove the part of the semiconductor layer which covers the substrate 210 and is not sheltered by the second margin metal layer 2621 and the first middle metal layer 2612. The other part of the semiconductor layer which is sheltered by the second margin metal layer 2621 and the first middle metal layer 2612 is reserved to be the margin semiconductor layer 2641 and the middle semiconductor layer 2642. In at least one embodiment, a material of the margin semiconductor layer 2641 and the middle semiconductor layer 2642 is oxide semiconductor.

Figure 10:
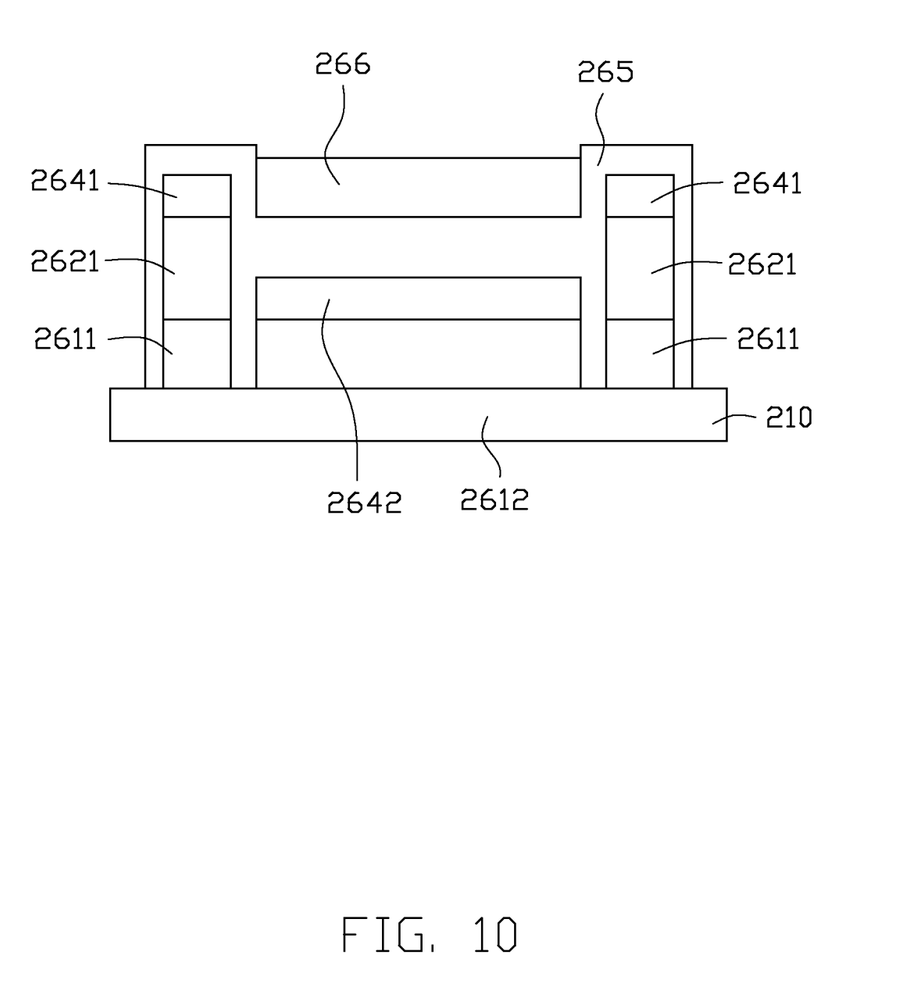
FIG. 10 shows a structure of FIG. 9 after a third metal layer and a second photoresist pattern are formed.

At block 208, also referring to FIG. 10, a third metal layer 265 is formed on and covers the substrate 210, the margin semiconductor layer 2641 and the middle semiconductor layer 2642, a second photoresist pattern 266 is formed on the third metal layer 265 and corresponding to the middle semiconductor layer 2642. The third metal layer 265 has an etching rate different from that of the second metal layer 262. The third metal layer 265 has a material thereof different from that of the second metal layer 262. In at least one embodiment, a material of the third metal layer 265 is copper. In at least one embodiment, the second photoresist pattern 266 can be formed by forming a second photoresist pattern 266 on the third metal layer 265, then defining a position of the second photoresist pattern 266 by photomask process.

Figure 11:
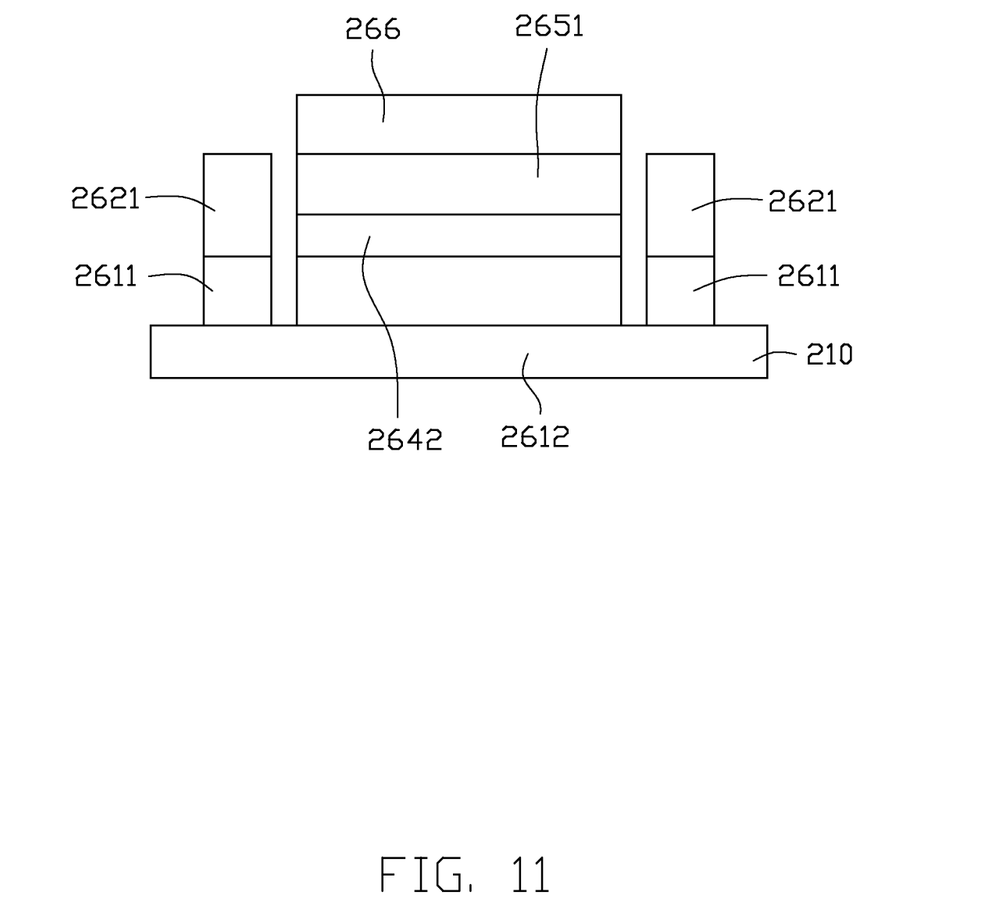
FIG. 11 shows a structure of FIG. 10 after a third middle metal layer is formed.

At block 209, also referring to FIG. 11, the margin semiconductor layer 2641 and a part of the third metal layer 265 which are not covered by the second photoresist pattern 266 are removed to form a third middle metal layer 2651. In at least one embodiment, the margin semiconductor layer 2641 and the part of the third metal layer 265 which are not covered by the second photoresist pattern 266 are removed by a wet etching. In at least one alternative embodiment, the part of the third metal layer 265 which is not covered by the second photoresist pattern 266 is removed firstly by a dry etching, then the margin semiconductor layer 2641 which is not covered by the second photoresist pattern 266 is removed by the wet etching. In the alternative embodiment, the third metal layer 265 can have a material thereof same as that of the second metal layer 262.

Figure 12:
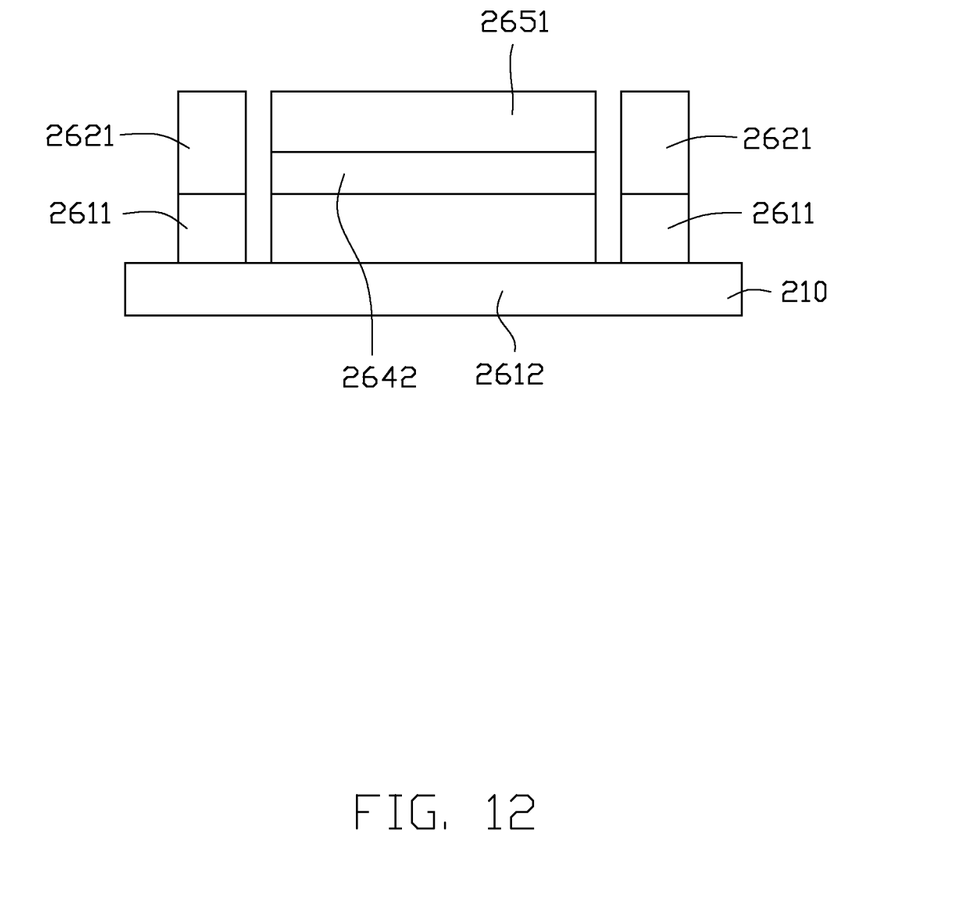
FIG. 12 shows a structure of FIG. 11 after the second photoresist pattern is removed.

At block 210, also referring to FIG. 12, the second photoresist pattern 266 is removed.

Figure 13:
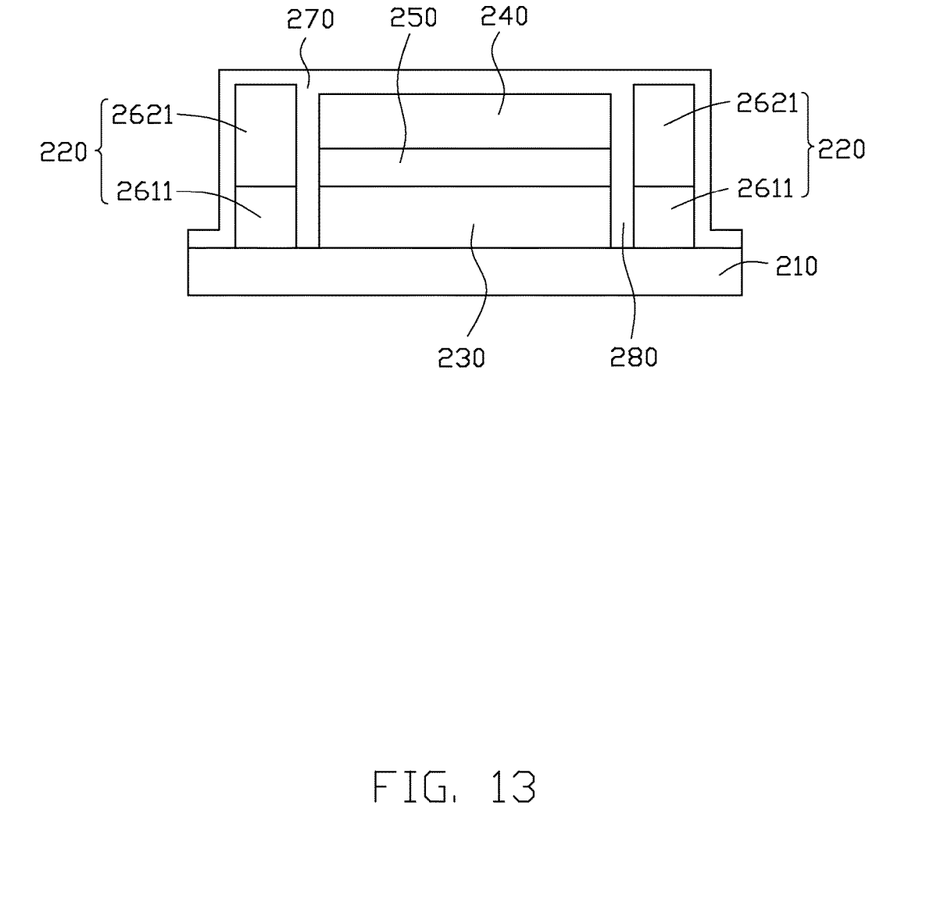
FIG. 13 shows a structure of FIG. 12 after an electrically insulating layer is formed.

At block 211, also referring to FIG. 13, the electrically insulating layer 270 is formed on and covers the substrate 210, the second margin metal layer 2621 and the third middle metal layer 2651, and filled in the passage 280 between the first margin metal layer 2611, the second margin metal layer 2621 and the first middle metal layer 2612, the middle semiconductor layer 2642 and the third middle metal layer 2651. The first margin metal layer 2611 and the second margin metal layer 2621 cooperatively form the gate electrode 220 of the thin film transistor 200. The first middle metal layer 2612 and the third middle metal layer 2651 can be the source electrode and the drain electrode of the thin film transistor 200 respectively. The middle semiconductor layer 2642 can be the channel layer 250 of the thin film transistor 200. In at least one embodiment, the first margin metal layer 2611 or the second margin metal layer 2621 can individually be the gate electrode of the thin film transistor 200.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method for manufacturing a thin film transistor comprising:
    providing a substrate;
    forming, successively, a first metal layer, a second metal layer, and a first photoresist layer on the substrate;
    patterning the first photoresist layer to form a first photoresist pattern comprising a first margin photoresist pattern and a first middle photoresist pattern spaced apart from the first margin photoresist pattern;
    etching the first metal layer and the second metal layer to form a first margin metal layer corresponding to the first margin photoresist pattern, a second margin metal layer corresponding to the first margin photoresist pattern, a first middle metal layer corresponding to the first middle photoresist pattern, and a second middle metal layer corresponding to the first middle photoresist pattern;
    removing the first middle photoresist pattern;
    entirely removing the second middle metal layer, the first middle metal layer defining a first electrode which is one of a source electrode and a drain electrode;
    removing the first margin photoresist pattern,
    forming a semiconductor layer covering the substrate, the second margin metal layer, and the first middle metal layer, the semiconductor layer directly in contact with the substrate, the second margin metal layer, and the first middle metal layer;
    removing a portion of the semiconductor layer directly covering the substrate to form a margin semiconductor layer on the second margin metal layer and a middle semiconductor layer on the first middle metal layer, the middle semiconductor layer defining a channel layer;
    forming a third metal layer covering the substrate, the margin semiconductor layer, and the middle semiconductor layer;
    forming a second photoresist pattern on the third metal layer and the second photoresist pattern corresponding to the middle semiconductor layer;
    entirely removing the margin semiconductor layer and removing a portion of the third metal layer not covered by the second photoresist pattern to form a third middle metal layer covered by the second photoresist pattern, the third middle metal layer defining a second electrode, and the second electrode is the other one of the source electrode and the drain electrode; and
    removing the second photoresist pattern.

2. The method of claim 1, further comprising, after the removing the second photoresist pattern, forming an electrically insulating layer covering the substrate, the second margin metal layer, and the third middle metal layer, and filling between the first margin metal layer and a combination of the first middle metal layer, the middle semiconductor layer, and the third middle metal layer, and filling between the second margin metal layer and a combination of the first middle metal layer, the middle semiconductor layer, and the third middle metal layer.

3. The method of claim 1, wherein the first metal layer is made of a material different from a material of the second metal layer.

4. The method of claim 3, wherein the material of the first metal layer is titanium, the material of the second metal layer is aluminum.

5. The method of claim 1, wherein the patterning the first photoresist layer to form a first photoresist pattern is by a gray-scale mask pattern.

6. The method of claim 5, wherein the first margin photoresist pattern has thickness greater than a thickness of the first middle photoresist pattern.

7. The method of claim 6, wherein in the removing the first middle photoresist pattern, an entire thickness of the first photoresist pattern is reduced by an oxygen ions ashing process until the first middle photoresist pattern is removed.

8. The method of claim 1, wherein after the forming the semiconductor layer, the substrate with the semiconductor layer is photo-etched from a side of the substrate away from the second margin metal layer and the first middle metal layer, to remove the portion of the semiconductor layer directly covering the substrate and not protected by the second margin metal layer and the first middle metal layer, to form the margin semiconductor layer and the middle semiconductor layer.

9. The method of claim 1, wherein the semiconductor layer has a material of oxide semiconductor.

10. The method of claim 1, wherein the third metal layer is made of a material different from a material of the second metal layer.

11. The method of claim 10, wherein the material of the third metal layer is copper.

12. The method of claim 1, wherein after the forming a second photoresist pattern, the margin semiconductor layer, and the portion of the third metal layer not covered by the second photoresist pattern, are removed by a wet etching.

13. The method of claim 1, wherein after the forming a second photoresist pattern, the portion of the third metal layer not covered by the second photoresist pattern is removed firstly by a dry etching, then the margin semiconductor layer not covered by the second photoresist pattern is removed by the wet etching.

* * * * *